US011151943B1

(12) United States Patent
Xue et al.

(10) Patent No.: US 11,151,943 B1
(45) Date of Patent: Oct. 19, 2021

(54) GATE DRIVER ON ARRAY CIRCUIT

(71) Applicant: SHENZHEN CHINA STAR OPTOELECTRONICS SEMICONDUCTOR DISPLAY TECHNOLOGY CO., LTD., Shenzhen (CN)

(72) Inventors: Yan Xue, Shenzhen (CN); Baixiang Han, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 179 days.

(21) Appl. No.: 16/621,732

(22) PCT Filed: Dec. 4, 2019

(86) PCT No.: PCT/CN2019/122957
§ 371 (c)(1),
(2) Date: Dec. 12, 2019

(87) PCT Pub. No.: WO2021/047071
PCT Pub. Date: Mar. 18, 2021

(30) Foreign Application Priority Data

Sep. 10, 2019 (CN) .......................... 201910850549.2

(51) Int. Cl.
*G09G 3/3266* (2016.01)
*G09G 3/36* (2006.01)

(52) U.S. Cl.
CPC ......... *G09G 3/3266* (2013.01); *G09G 3/3677* (2013.01); *G09G 2310/0202* (2013.01); *G09G 2310/0286* (2013.01)

(58) Field of Classification Search
CPC .............. G09G 3/3677; G09G 3/3266; G09G 2310/02–024; G09G 2310/0286–0294
See application file for complete search history.

(56) References Cited

U.S. PATENT DOCUMENTS

2016/0019840 A1* 1/2016 Cao ...................... G09G 3/3233
345/214
2016/0042693 A1* 2/2016 Cao ...................... G09G 3/3258
345/212

(Continued)

FOREIGN PATENT DOCUMENTS

CN 103871348 A 6/2014
CN 103943058 A 7/2014

(Continued)

*Primary Examiner* — David Tung
(74) *Attorney, Agent, or Firm* — Osha Bergman Watanabe & Burton LLP

(57) ABSTRACT

A gate driver on array (GOA) circuit is provided. The GOA circuit is designed to form a GOA sharing unit by arranging adjacent two stage GOA units in a conventional GOA circuit. A new GOA circuit enables single-stage GOA circuit to be shared every two stages of GOA output signals. The new GOA circuit can reduce a number of thin film transistors in the GOA circuit and reduce a wiring design, which helps to reduce a design space of the GOA circuit, realizes a narrow bezel design, simplifies the GOA circuit, and can reduce power consumption of the GOA circuit.

18 Claims, 3 Drawing Sheets

(56) References Cited

U.S. PATENT DOCUMENTS

| | | | | |
|---|---|---|---|---|
| 2016/0064098 A1* | 3/2016 | Han | ................... | G09G 3/3225 |
| | | | | 345/211 |
| 2017/0039950 A1* | 2/2017 | Li | ................... | G09G 3/3266 |
| 2017/0256218 A1 | 9/2017 | Dai | | |
| 2019/0066596 A1* | 2/2019 | Xue | ................... | G11C 19/184 |
| 2020/0027516 A1* | 1/2020 | Feng | ................... | G11C 19/287 |
| 2020/0357341 A1* | 11/2020 | Xue | ................... | G09G 3/3266 |

FOREIGN PATENT DOCUMENTS

| | | | |
|---|---|---|---|
| CN | 105139816 | A | 12/2015 |
| CN | 107393473 | A | 11/2017 |
| CN | 109712552 | A | 5/2019 |
| CN | 109961737 | A | 7/2019 |
| KR | 20180066934 | A | 6/2018 |

\* cited by examiner

GATE DRIVER ON ARRAY CIRCUIT

FIELD OF INVENTION

The present disclosure relates to the field of display technologies, and more particularly to a gate driver on array (GOA) circuit.

BACKGROUND OF INVENTION

Driving of horizontal scanning lines of current active-matrix organic light-emitting diode (AMOLED) display panels are realized by external integrated circuits. The external integrated circuits can control stepwise charging and discharging of row scanning lines of each stage. Gate driver on array (GOA) technologies are based on a thin film transistor (TFT) liquid crystal display array process to fabricate a gate scanning driving circuit on a thin film transistor array substrate to realize stepwise driving of row scanning, which has advantages of reducing production cost and realizing a narrow frame design of a panel, and is used for various displays. Therefore, the GOA technologies can integrate a line scanning driving circuit on an array substrate of a display panel, thereby significantly reducing usage of an external integrated circuit (IC), thereby reducing the production cost and power consumption of the display panel, and enabling a narrow frame of the display device.

Current oxide semiconductor gate driver on array (IGZO-GOA) circuits are complicated, and each stage circuit includes a plurality of working modules. At present, large-sized display panels have become a major trend in the industry. As panel size and a number of gate drive lines increase, this results in a larger layout area of each stage of the GOA circuit, which is disadvantageous for achieving the narrow frame of the display device, and the load increase also increases power consumption of the GOA module.

SUMMARY OF INVENTION

In order to solve the above technical problems, an object of an embodiment of the present disclosure is to provide a gate driver on array (GOA) circuit.

To achieve the above object, an embodiment of the present disclosure provides a gate driver on array (GOA) circuit. The GOA circuit includes:

a cascaded multi-stage GOA circuit sharing unit, wherein each stage GOA circuit sharing unit comprises a feedback module, a pull-up control module, a pull-up module, a bootstrap capacitor module, a first pull-down maintenance module, a second pull-down maintenance module, a first pull-down module, and a second pull-down module;

wherein the pull-up control module, the bootstrap capacitor module, the pull-up module, the first and second pull-down maintaining modules, and the first and second pull-down modules are all electrically connected to a first node Q, and the feedback module is electrically connected to a second node N;

wherein in the GOA circuit, each two-stage GOA circuit shares a first-stage GOA circuit;

wherein let M and n be positive integers, except for first-stage and second-stage GOA circuit sharing units, in a nth stage GOA circuit sharing unit:

the pull-up module is connected to M+2th and M+3th clock signals CK(M+2) and CK(M+3), and uses the M+2th and M+3th clock signals CK(M+2) and CK(M+3) to output nth and n-F1th stage signals (Cout(n) and Cout(n+1)) and nth and n+1th scanning signals (G (n) and G(n+1));

the pull-up control module is connected to a Mth clock signal CK(M) and a n−2th stage signal Cout(n−2) outputted by a former two-stage n−2th stage GOA circuit sharing unit, and the n−2th stage signal Cout (n−2) is used to charge the first node Q;

the first pull-down module is connected to at least n+3th and n+4th stage signals (Cout(n+3) and Cout(n+4)) outputted by a latter three-stage n+3th stage GOA circuit sharing unit and a latter four-stage n+4th stage GOA circuit sharing unit and a first negative potential (VGL1), and the second pull-down module is connected to at least the n+4th stage signal Cout(n+4) outputted by the latter four-stage n+4th stage GOA circuit sharing unit and a second negative potential (VGL2);

the first pull-down maintenance module is connected to at least the first negative potential (VGL1), a high potential (VGH), and a third node QB, and the second pull-down maintenance module is connected to at least the third node QB;

the feedback module is connected to at least the M+2th and M+3th clock signals CK(M+2) and CK(M+3) and the nth and n+1th stage signals (Cout(n) and Cout(n+1));

wherein except for first-stage and second-stage GOA circuit sharing units, in the nth stage GOA circuit sharing unit:

the pull-up control module comprises an eleventh thin film transistor, a gate of the eleventh thin film transistor is connected to the n−2th stage signal Cout(n−2) outputted by the former two-stage n−2th stage GOA circuit sharing unit, a source thereof is connected to the Mth clock signal CK(M), and a drain thereof is electrically connected to the second node N; and a twelfth thin film transistor, a gate of the twelfth thin film transistor is connected to the n−2th stage signal Cout (n−2) outputted by the former two-stage n−2th stage GOA circuit sharing unit, a source thereof is electrically connected to the second node N, and a drain thereof is electrically connected to the first node Q;

wherein the pull-up module comprises:

a twenty-first thin film transistor, a gate of the twenty-first thin film transistor is electrically connected to the first node Q, a source thereof is connected to the M+3th clock signal CK(M+3), and a drain thereof is electrically connected the n+1th scanning signal G(n+1) outputted by a latter one-stage n+1th stage GOA circuit sharing unit;

a twenty-second thin film transistor, a gate of the twenty-second thin film transistor is electrically connected to the first node Q, a source thereof is connected to the M+2th clock signal CK(M+2), and a drain thereof is electrically connected the nth scanning signal G(n);

a twenty-third thin film transistor, a gate of the twenty-third thin film transistor is electrically connected to the first node Q, a source thereof is connected to the M+3th clock signal CK(M+3), and a drain thereof is electrically connected to the n+1th stage signal Cout(n+1) outputted by the latter one-stage n+1th stage GOA circuit sharing unit; and a twenty-fourth thin film transistor, a gate of the twenty-fourth thin film transistor is electrically connected to the first node Q, a source thereof is connected to the M+2th clock signal CK(M+2), and a drain thereof is electrically connected to the nth stage signal Cout(n).

In an embodiment of the present disclosure, the second pull-down module comprises a thirty-first thin film transistor, a gate of the thirty-first thin film transistor is electrically connected to the n+4th stage signal Cout(n+4) outputted by the latter four-stage n+4th stage GOA circuit sharing unit, a source thereof is electrically connected to the n+1th scanning signal G(n+1) outputted by the latter one-stage n+1th stage GOA circuit sharing unit, and a drain thereof is electrically connected to the second negative potential (VGL2).

In an embodiment of the present disclosure, the first pull-down module comprises:
- a thirty-second thin film transistor, a gate of the thirty-second thin film transistor is electrically connected to the n+3th stage signal Cout(n+3) outputted by the latter three-stage n+3th stage GOA circuit sharing unit, a source thereof is electrically connected to the nth scanning signal G(n), and a drain thereof is electrically connected to the second negative potential (VGL2);
- a thirty-third thin film transistor, wherein a gate of the thirty-third thin film transistor is electrically connected to the n+4th stage signal Cout(n+4) outputted by the latter four-stage n+4th stage GOA circuit sharing unit, a source thereof is electrically connected to the first node Q, and a drain thereof is electrically connected to the second node N; and
a thirty-fourth thin film transistor, wherein a gate of the thirty-fourth thin film transistor is electrically connected to the n+4th stage signal Cout(n+4) outputted by the latter four-stage n+4th stage GOA circuit sharing unit, a source thereof is electrically connected to the second node N, and a drain thereof is electrically connected to the first negative potential (VGL1).

In an embodiment of the present disclosure, the first pull-down maintaining module comprises a forty-third thin film transistor, a forty-fourth thin film transistor, a forty-fifth thin film transistor, a forty-sixth thin film transistor, a fifty-first thin film transistor, a fifty-second thin film transistor, a fifty-third thin film transistor, and a fifty-fourth thin film transistor;
- a gate of the forty-third thin film transistor is electrically connected to the third node QB, and a source thereof is electrically connected to the n+1th stage signal Cout(n+1) outputted by the latter one-stage n+1th stage GOA circuit sharing unit, and a drain thereof is electrically connected to the second negative potential (VGL2); a gate of the forty-fourth thin film transistor is electrically connected to the third node QB, a source thereof is electrically connected to the nth stage signal Cout(n) outputted by the nth stage GOA circuit sharing unit, and a drain thereof is electrically connected to the second negative potential (VGL2); a gate of the forty-fifth thin film transistor is electrically connected to the third node QB, a source thereof is electrically connected to the second node N, and a drain thereof is electrically connected to the first negative potential (VGL1); a gate of the forty-sixth thin film transistor is electrically connected to the third node QB, a source thereof is electrically connected to the first node Q, and a drain thereof is electrically connected to the second node N;
- the fifty-first thin film transistor and the fifty-second thin film transistor are first dual gate transistors, and the fifty-third thin film transistor and the fifty-fourth thin film transistor are second double gate transistors;

the first dual gate transistor comprises a source transistor and a drain transistor, and the source transistor and the drain transistor of the first dual gate transistor have a gate, a source, and a drain, respectively, the source and the gate of the source transistor of the first dual gate transistor are electrically connected to a high potential (VGH), the drain of the source transistor of the first dual gate transistor is electrically connected to the source of the drain transistor of the first dual gate transistor, the gate of the drain transistor of the first dual gate transistor is electrically connected to the first node Q, and the drain of the drain transistor of the first dual gate transistor is electrically connected to the first negative potential (VGL1);

the second dual gate transistor comprises a source transistor and a drain transistor, and the source transistor and the drain transistor of the second dual gate transistor have a gate, a source, and a drain, respectively, the gate of the source transistor of the second dual gate transistor is electrically connected to the drain of the source transistor of the first dual gate transistor, the source of the source transistor of the second dual gate transistor is electrically connected to the high potential (VGH), the drain of the source transistor of the second dual gate transistor is electrically connected to the source of the drain transistor and is electrically connected to the third node QB, the gate of the drain transistor of the second dual gate transistor is electrically connected to the first node Q, and the drain of the drain transistor of the second dual gate transistor is electrically connected to the first negative potential (VGL1).

In an embodiment of the present disclosure, the second pull-down maintaining module comprises a forty-first thin film transistor and a forty-second thin film transistor; a gate of the forty-first thin film transistor is electrically connected to the third node QB, a source thereof is electrically connected to the n+1th scanning signal G(n+1) outputted by the latter one-stage n+1th stage GOA circuit sharing unit, and a drain thereof is electrically connected to the second negative potential (VGL2); a gate of the forty-second thin film transistor is electrically connected to the third node QB, a source thereof is electrically connected to the nth scanning signal G(n) outputted by the nth stage GOA circuit sharing unit, and a drain thereof is electrically connected to the second negative potential (VGL2).

In an embodiment of the present disclosure, the feedback module comprises a sixty-first thin film transistor and a sixty-second thin film transistor; a gate of the sixty-first thin film transistor is electrically connected to the M+2th clock signal CK(M+2), a source thereof is electrically connected to the nth stage signal Cout(n) outputted by the nth stage GOA circuit sharing unit, and a drain thereof is electrically connected to the second node N; a gate of the sixty-second thin film transistor is electrically connected to the M+3th clock signal CK(M+3), a source thereof is electrically connected to the second node N, and a drain thereof is electrically connected to the n+1th stage signal Cout(n+1) outputted by the latter one-stage n+1th stage GOA circuit sharing unit.

In an embodiment of the present disclosure, in the first-stage and second-stage GOA circuit sharing units, gates of the eleventh thin film transistor and the twelfth thin film transistor are electrically connected to a start signal (STV) of the GOA circuit.

In an embodiment of the present disclosure, the GOA circuit further comprises six clock signals comprising first, second, third, fourth, fifth, and sixth clock signals (CK(1), CK(2), CK(3), CK(4), CK(5), CK(6)), wherein when the Mth clock signal (CK(M)) is the second clock signal (CK(2)), the M+2th clock signal (CK(M+2)) is the fourth clock signal (CK(4)), and the M+3th clock signal (CK(M+3)) is the fifth clock signal (CK (5)), when the Mth clock signal (CK(M)) is the fourth clock signal (CK(4)), the M+2th clock signal (CK(M+2)) is the sixth clock signal (CK(6)), and the M+3th clock signal (CK(M+3)) is the first clock signal (CK(1)), when the Mth clock signal (CK(M)) is the sixth clock signal (CK(6)), the M+2th clock signal (CK(M+2)) is the second clock signal (CK(2)), and the M+3th clock signal (CK(M+3)) is the third clock signal (CK(3));

wherein in the first-stage GOA circuit sharing unit and the second-stage GOA circuit sharing unit, the pull-up module is connected to the fourth and fifth clock signals (CK(4), CK(5)), the pull-up control module is connected to the second clock signal (CK(2)), and the feedback module is connected to the fourth and fifth clock signals (CK(4), CK(5)); in a latter two-stage GOA circuit sharing unit, the pull-up control module is connected to the Mth clock signal CK(M), and the Mth clock signal is the fourth clock signal.

An embodiment of the present disclosure further provides a gate driver on array (GOA) circuit. The GOA circuit includes:

a cascaded multi-stage GOA circuit sharing unit, wherein each stage GOA circuit sharing unit comprises a feedback module, a pull-up control module, a pull-up module, a bootstrap capacitor module, a first pull-down maintenance module, a second pull-down maintenance module, a first pull-down module, and a second pull-down module;

wherein the pull-up control module, the bootstrap capacitor module, the pull-up module, the first and second pull-down maintaining modules, and the first and second pull-down modules are all electrically connected to a first node Q, and the feedback module is electrically connected to a second node N;

wherein in the GOA circuit, each two-stage GOA circuit shares a first-stage GOA circuit;

wherein let M and n be positive integers, except for first-stage and second-stage GOA circuit sharing units, in a nth stage GOA circuit sharing unit:

the pull-up module is connected to M+2th and M+3th clock signals CK(M+2) and CK(M+3), and uses the M+2th and M+3th clock signals CK(M+2) and CK(M+3) to output nth and n+1th stage signals (Cout(n) and Cout(n+1)) and nth and n+1th scanning signals (G (n) and G(n+1));

the pull-up control module is connected to a Mth clock signal CK(M) and a n−2th stage signal Cout(n−2) outputted by a former two-stage n−2th stage GOA circuit sharing unit, and the n−2th stage signal Cout (n−2) is used to charge the first node Q;

the first pull-down module is connected to at least n+3th and n+4th stage signals (Cout(n+3) and Cout(n+4)) outputted by a latter three-stage n+3th stage GOA circuit sharing unit and a latter four-stage n+4th stage GOA circuit sharing unit and a first negative potential (VGL1), and the second pull-down module is connected to at least the n+4th stage signal Cout(n+4) outputted by the latter four-stage n+4th GOA circuit sharing unit and a second negative potential (VGL2);

the first pull-down maintenance module is connected to at least the first negative potential (VGL1), a high potential (VGH), and a third node QB, and the second pull-down maintenance module is connected to at least the third node QB;

the feedback module is connected to at least the M+2th and M+3th clock signals CK(M+2) and CK(M+3) and the nth and n+1th stage signals (Cout(n) and Cout(n+1)).

In an embodiment of the present disclosure, except for first-stage and second-stage GOA circuit sharing units, in the nth stage GOA circuit sharing unit:

the pull-up control module comprises an eleventh thin film transistor, a gate of the eleventh thin film transistor is connected to the n−2th stage signal Cout(n−2) outputted by the former two-stage n−2th stage GOA circuit sharing unit, a source thereof is connected to the Mth clock signal CK(M), and a drain thereof is electrically connected to the second node N; and a twelfth thin film transistor, a gate of the twelfth thin film transistor is connected to the n−2th stage signal Cout (n−2) outputted by the former two-stage n−2th stage GOA circuit sharing unit, a source thereof is electrically connected to the second node N, and a drain thereof is electrically connected to the first node Q.

In an embodiment of the present disclosure, the pull-up module comprises:

a twenty-first thin film transistor, a gate of the twenty-first thin film transistor is electrically connected to the first node Q, a source thereof is connected to the M+3th clock signal CK(M+3), and a drain thereof is electrically connected the n+1th scanning signal G(n+1) outputted by a latter one-stage n+1th stage GOA circuit sharing unit;

a twenty-second thin film transistor, a gate of the twenty-second thin film transistor is electrically connected to the first node Q, a source thereof is connected to the M+2th clock signal CK(M+2), and a drain thereof is electrically connected the nth scanning signal G(n);

a twenty-third thin film transistor, a gate of the twenty-third thin film transistor is electrically connected to the first node Q, a source thereof is connected to the M+3th clock signal CK(M+3), and a drain thereof is electrically connected to the n+1th stage signal Cout(n+1) outputted by the latter one-stage n+1th stage GOA circuit sharing unit; and a twenty-fourth thin film transistor, a gate of the twenty-fourth thin film transistor is electrically connected to the first node Q, a source thereof is connected to the M+2th clock signal CK(M+2), and a drain thereof is electrically connected to the nth stage signal Cout(n).

In an embodiment of the present disclosure, the second pull-down module comprises a thirty-first thin film transistor, a gate of the thirty-first thin film transistor is electrically connected to the n+4th stage signal Cout(n+4) outputted by the latter four-stage n+4th stage GOA circuit sharing unit, a source thereof is electrically connected to the n+1th scanning signal G(n+1) outputted by the latter one-stage n+1th stage GOA circuit sharing unit, and a drain thereof is electrically connected to the second negative potential (VGL2).

In an embodiment of the present disclosure, the first pull-down module comprises:

a thirty-second thin film transistor, a gate of the thirty-second thin film transistor is electrically connected to the n+3th stage signal Cout(n+3) outputted by the latter three-stage n+3th stage GOA circuit sharing unit, a source thereof is electrically connected to the nth scanning signal G(n), and a drain thereof is electrically connected to the second negative potential (VGL2);

a thirty-third thin film transistor, wherein a gate of the thirty-third thin film transistor is electrically connected to the n+4th stage signal Cout(n+4) outputted by the latter four-stage n+4th stage GOA circuit sharing unit, a source thereof is electrically connected to the first node Q, and a drain thereof is electrically connected to the second node N; and a thirty-fourth thin film transistor, wherein a gate of the thirty-fourth thin film transistor is electrically connected to the n+4th stage signal Cout(n+4) outputted by the latter four-stage n+4th stage GOA circuit sharing unit, a source thereof is electrically connected to the second node N, and a drain thereof is electrically connected to the first negative potential (VGL1).

In an embodiment of the present disclosure, the first pull-down maintaining module comprises a forty-third thin film transistor, a forty-fourth thin film transistor, a forty-fifth thin film transistor, a forty-sixth thin film transistor, a fifty-first thin film transistor, a fifty-second thin film transistor, a fifty-third thin film transistor, and a fifty-fourth thin film transistor;

a gate of the forty-third thin film transistor is electrically connected to the third node QB, and a source thereof is electrically connected to the n+1th stage signal Cout(n+1) outputted by the latter one-stage n+1th stage GOA circuit sharing unit, and a drain thereof is electrically connected to the second negative potential (VGL2); a gate of the forty-fourth thin film transistor is electrically connected to the third node QB, a source thereof is electrically connected to the nth stage signal Cout(n) outputted by the nth stage GOA circuit sharing unit, and a drain thereof is electrically connected to the second negative potential (VGL2); a gate of the forty-fifth thin film transistor is electrically connected to the third node QB, a source thereof is electrically connected to the second node N, and a drain thereof is electrically connected to the first negative potential (VGL1); a gate of the forty-sixth thin film transistor is electrically connected to the third node QB, a source thereof is electrically connected to the first node Q, and a drain thereof is electrically connected to the second node N;

the fifty-first thin film transistor and the fifty-second thin film transistor are first dual gate transistors, and the fifty-third thin film transistor and the fifty-fourth thin film transistor are second double gate transistors;

the first dual gate transistor comprises a source transistor and a drain transistor, and the source transistor and the drain transistor of the first dual gate transistor have a gate, a source, and a drain, respectively, the source and the gate of the source transistor of the first dual gate transistor are electrically connected to a high potential (VGH), the drain of the source transistor of the first dual gate transistor is electrically connected to the source of the drain transistor of the first dual gate transistor, the gate of the drain transistor of the first dual gate transistor is electrically connected to the first node Q, and the drain of the drain transistor of the first dual gate transistor is electrically connected to the first negative potential (VGL1);

the second dual gate transistor comprises a source transistor and a drain transistor, and the source transistor and the drain transistor of the second dual gate transistor have a gate, a source, and a drain, respectively, the gate of the source transistor of the second dual gate transistor is electrically connected to the drain of the source transistor of the first dual gate transistor, the source of the source transistor of the second dual gate transistor is electrically connected to the high potential (VGH), the drain of the source transistor of the second dual gate transistor is electrically connected to the source of the drain transistor and is electrically connected to the third node QB, the gate of the drain transistor of the second dual gate transistor is electrically connected to the first node Q, and the drain of the drain transistor of the second dual gate transistor is electrically connected to the first negative potential (VGL1).

In an embodiment of the present disclosure, the second pull-down maintaining module comprises a forty-first thin film transistor and a forty-second thin film transistor; a gate of the forty-first thin film transistor is electrically connected to the third node QB, a source thereof is electrically connected to the n+1th scanning signal G(n+1) outputted by the latter one-stage n+1th stage GOA circuit sharing unit, and a drain thereof is electrically connected to the second negative potential (VGL2); a gate of the forty-second thin film transistor is electrically connected to the third node QB, a source thereof is electrically connected to the nth scanning signal G(n) outputted by the nth stage GOA circuit sharing unit, and a drain thereof is electrically connected to the second negative potential (VGL2).

In an embodiment of the present disclosure, the feedback module comprises a sixty-first thin film transistor and a sixty-second thin film transistor; a gate of the sixty-first thin film transistor is electrically connected to the M+2th clock signal CK(M+2), a source thereof is electrically connected to the nth stage signal Cout(n) outputted by the nth stage GOA circuit sharing unit, and a drain thereof is electrically connected to the second node N; a gate of the sixty-second thin film transistor is electrically connected to the M+3th clock signal CK(M+3), a source thereof is electrically connected to the n+1th stage signal Cout(n+1) outputted by the latter one-stage n+1th stage GOA circuit sharing unit.

In an embodiment of the present disclosure, in the first-stage and second-stage GOA circuit sharing units, gates of the eleventh thin film transistor and the twelfth thin film transistor are electrically connected to a start signal (STV) of the GOA circuit.

In an embodiment of the present disclosure, the GOA circuit further comprises six clock signals comprising first, second, third, fourth, fifth, and sixth clock signals (CK(1), CK(2), CK(3), CK(4), CK(5), CK(6)), wherein when the Mth clock signal (CK(M)) is the second clock signal (CK(2)), the M+2th clock signal (CK(M+2)) is the fourth clock signal (CK(4)), and the M+3th clock signal (CK(M+3)) is the fifth clock signal (CK (5)), when the Mth clock signal (CK(M)) is the fourth clock signal (CK(4)), the M+2th clock signal (CK(M+2)) is the sixth clock signal (CK(6)), and the M+3th clock signal (CK(M+3)) is the first clock signal (CK(1)), when the Mth clock signal (CK(M)) is the sixth clock signal (CK(6)), the M+2th clock signal (CK(M+2)) is the second clock signal (CK(2)), and the M+3th clock signal (CK(M+3)) is the third clock signal (CK(3));

wherein in the first-stage GOA circuit sharing unit and the second-stage GOA circuit sharing unit, the pull-up module is connected to the fourth and fifth clock signals (CK(4), CK(5)), the pull-up control module is connected to the second clock signal (CK(2)), and the feedback module is connected to the fourth and fifth clock signals (CK(4), CK(5)); in a latter two-stage GOA circuit sharing unit, the pull-up control module is connected to the Mth clock signal CK(M), and the Mth clock signal is the fourth clock signal.

Beneficial effects of an embodiment of the present disclosure are that, a gate driver on array (GOA) circuit is provided. The GOA circuit is designed to form a GOA sharing unit by arranging adjacent two stage GOA units in a conventional GOA circuit. A new GOA circuit enables single-stage GOA circuit to be shared every two stages of GOA output signals. The new GOA circuit can reduce a number of thin film transistors in the GOA circuit and reduce a wiring design, which helps to reduce a design space of the GOA circuit, realizes a narrow bezel design, simplifies the GOA circuit, and can reduce power consumption of the GOA circuit.

DETAILED DESCRIPTION OF PREFERRED EMBODIMENTS

Figure 1:
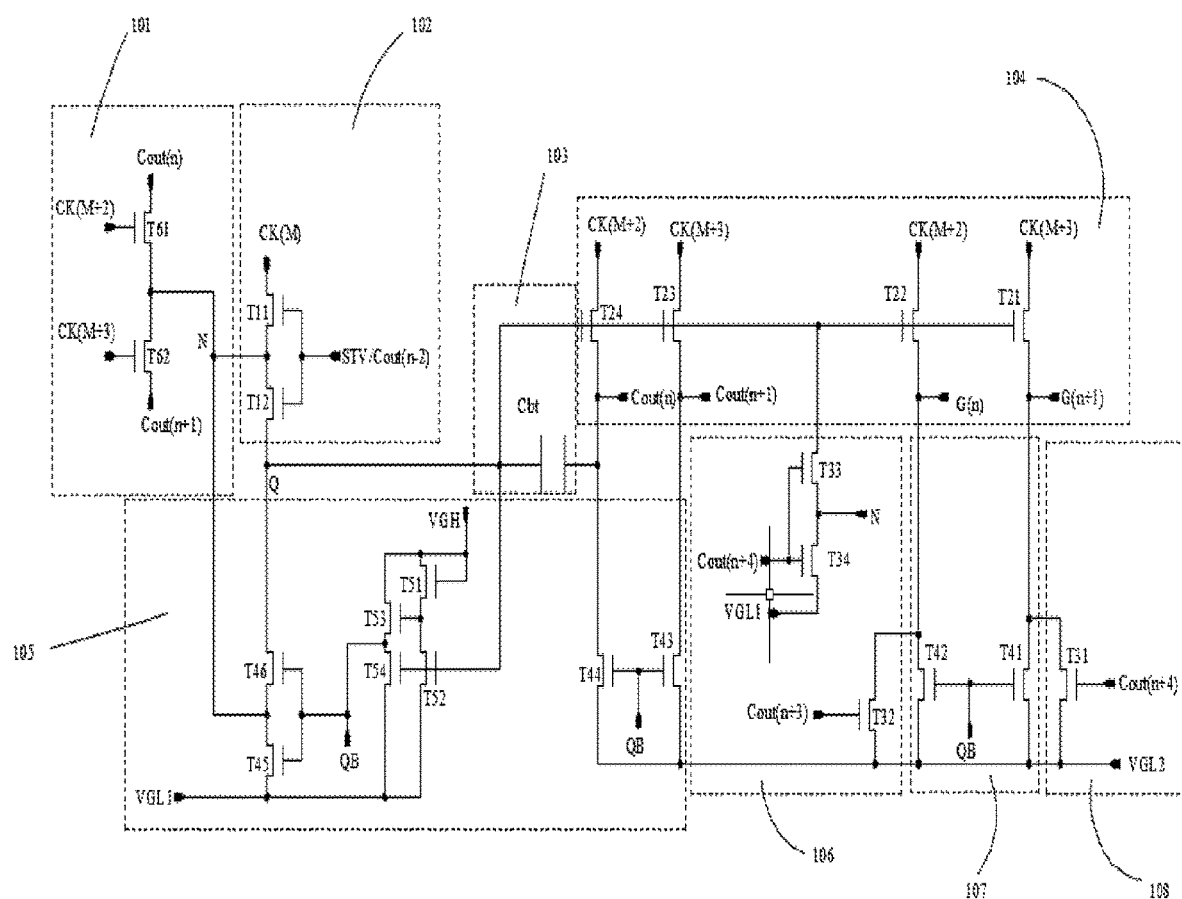
FIG. 1 is a structural diagram of a single-stage GOA circuit according to an embodiment of the present disclosure.

The following description of the various embodiments is provided to illustrate the specific embodiments by referring to the accompanying drawings.

The above and other objects, features, and advantages of the present disclosure will be more apparent and obvious. Hereinafter, the preferred embodiments of the present disclosure will be described in detail with reference to the accompanying drawings. In addition, directional terms described by the present disclosure, such as up, down, top, bottom, front, back, left, right, inner, outer, side, surrounding, central, level, horizontal, vertical, perpendicular, axial, radial, uppermost, lowermost, etc., are only directions by referring to the accompanying drawings, and thus the used terms are used only for the purpose of describing embodiments of the present disclosure and are, not intended to be limiting of the present disclosure.

In order to further explain the technical means and effects of the present invention, the following detailed description will be made in conjunction with the embodiments of the invention and the accompanying drawings. In the drawings, units with similar structures are labeled with the same reference number.

An embodiment of the present disclosure provide a gate driver on array (GOA) circuit. The GOA circuit comprises a cascaded multi-stage GOA circuit sharing unit, each stage GOA circuit sharing unit comprises a feedback module 101, a pull-up control module 102, a bootstrap capacitor module 103, a pull-up module 104, a first pull-down maintenance module 105, a second pull-down maintenance module 107, a first pull-down module 106, and a second pull-down module 108.

The pull-up control module 102, the bootstrap capacitor module 103, the pull-up module 104, the first and second pull-down maintaining modules 105 and 107, and the first and second pull-down modules 106 and 108 are all electrically connected to a first node Q, and the feedback module 101 is electrically connected to a second node N.

In the GOA circuit, each two-stage GOA circuit shares a first-stage GOA circuit.

Let M and n be positive integers, except for first-stage and second-stage GOA circuit sharing units, in a nth stage GOA circuit sharing unit:

The pull-up module 104 is connected to M+2th and M+3th clock signals CK(M+2) and CK(M+3), and uses the M+2th and M+3th clock signals CK(M+2) and CK(M+3) to output nth and n+1th stage signals (Cout(n) and Cout(n+1)) and nth and n+1th scanning signals (G (n) and G(n+1)).

The pull-up control module 102 is connected to a Mth clock signal CK(M) and a n−2th stage signal Cout(n−2) outputted by a former two-stage n−2th stage GOA circuit sharing unit, and the n−2th stage signal Cout(n−2) is used to charge the first node Q.

The first pull-down module 106 is connected to at least n+3th and n+4th stage signals (Cout(n+3) and Cout(n+4)) outputted by a latter three-stage n+3th stage GOA circuit sharing unit and a latter four-stage n+4th stage GOA circuit sharing unit and a first negative potential (VGL1), and the second pull-down module 108 is connected to at least the n+4th stage signal Cout(n+4) outputted by the latter four-stage n+4th stage GOA circuit sharing unit and a second negative potential (VGL2).

The first pull-down maintenance module 105 is connected to at least the first negative potential (VGL1), a high potential (VGH), and a third node QB, and the second pull-down maintenance module 107 is connected to at least the third node QB.

The feedback module 101 is connected to at least the M+2th and M+3th clock signals CK(M+2) and CK(M+3) and the nth and n+1th stage signals (Cout(n) and Cout(n+1)).

Referring to FIG. 1, which is a diagram of a GOA circuit according to an embodiment of the present invention. It is assumed that both M and n are positive integers. In the embodiment of the present invention, except for first-stage and second-stage GOA circuit sharing units, in the nth stage GOA circuit sharing unit:

The pull-up control module 102 of this embodiment is composed of two thin film transistors, and its function is to pull up the potential of the first node Q and control opening time of the pull-up circuit.

The pull-up control module 102 comprises: an eleventh thin film transistor T11, a gate of the eleventh thin film transistor T11 is connected to the n−2th stage signal Cout (n−2) outputted by the former two-stage n−2th stage GOA circuit sharing unit, a source thereof is connected to the Mth clock signal CK(M), and a drain thereof is electrically connected to the second node N; and A twelfth thin film transistor T12, a gate of the twelfth thin film transistor T12 is connected to the n−2th stage signal Cout(n−2) outputted by the former two-stage n−2th stage GOA circuit sharing unit, a source thereof is electrically connected to the second node N, and a drain thereof is electrically connected to the first node Q.

The pull-up module 104 of this embodiment is mainly responsible for converting clock signals into stage signals (Cout(n), Cout(n+1)) and output scanning signals (G(n), G(n+1)).

The pull-up module 104 comprises: a twenty-first thin film transistor T21, a gate of the twenty-first thin film transistor T21 is electrically connected to the first node Q, a source thereof is connected to the M+3th clock signal CK(M+3), and a drain thereof is electrically connected the n+1th scanning signal G(n+1) outputted by a latter one-stage n+1th stage GOA circuit sharing unit;

A twenty-second thin film transistor T22, a gate of the twenty-second thin film transistor T22 is electrically connected to the first node Q, a source thereof is connected to the M+2th clock signal CK(M+2), and a drain thereof is electrically connected the nth scanning signal G(n);

A twenty-third thin film transistor T23, a gate of the twenty-third thin film transistor T23 is electrically connected to the first node Q, a source thereof is connected to the M+3th clock signal CK(M+3), and a drain thereof is electrically connected to the n+1th stage signal Cout(n+1) outputted by the latter one-stage n+1th stage GOA circuit sharing unit; and A twenty-fourth thin film transistor T24, a gate of the twenty-fourth thin film transistor T24 is electrically connected to the first node Q, a source thereof is connected to the M+2th clock signal CK(M+2), and a drain thereof is electrically connected to the nth stage signal Cout(n).

The pull-down module of this embodiment mainly includes: a first pull-down module 106 and a second pull-down module 108, and the pull-down module is responsible for pulling down potentials of the first node Q and the output scanning signals (G(n), G(n+1)) to low potentials at a first time.

The first pull-down module 106 comprises: a thirty-second thin film transistor T32, a gate of the thirty-second thin film transistor T32 is electrically connected to the n+3th stage signal Cout(n+3) outputted by the latter three-stage n+3th stage GOA circuit sharing unit, a source thereof is electrically connected to the nth scanning signal G(n), and a drain thereof is electrically connected to the second negative potential (VGL2);

A thirty-third thin film transistor T33, wherein a gate of the thirty-third thin film transistor T33 is electrically connected to the n+4th stage signal Cout(n+4) outputted by the latter four-stage n+4th stage GOA circuit sharing unit, a source thereof is electrically connected to the first node Q, and a drain thereof is electrically connected to the second node N; and A thirty-fourth thin film transistor T34, wherein a gate of the thirty-fourth thin film transistor T34 is electrically connected to the n+4th stage signal Cout(n+4) outputted by the latter four-stage n+4th stage GOA circuit sharing unit, a source thereof is electrically connected to the second node N, and a drain thereof is electrically connected to the first negative potential (VGL1).

The second pull-down module 108 comprises a thirty-first thin film transistor T31, a gate of the thirty-first thin film transistor T31 is electrically connected to the n+4th stage signal Cout(n+4) outputted by the latter four-stage n+4th stage GOA circuit sharing unit, a source thereof is electrically connected to the n+1th scanning signal G(n+1) outputted by the latter one-stage n+1th stage GOA circuit sharing unit, and a drain thereof is electrically connected to the second negative potential (VGL2).

The pull-down maintaining module of this embodiment mainly includes: a first pull-down maintaining module 105 and a second pull-down maintaining module 107, wherein the pull-down maintaining module is responsible for maintaining and pulling down potentials of the first node Q, the stage signals (Cout(n), Cout(n+1)), and of the scanning signals (G(n), G(n+1)).

The first pull-down maintaining module 105 comprises a forty-third thin film transistor T43, a forty-fourth thin film transistor T44, a forty-fifth thin film transistor T45, a forty-sixth thin film transistor T46, a fifty-first thin film transistor T51, a fifty-second thin film transistor T52, a fifty-third thin film transistor T53, and a fifty-fourth thin film transistor T54.

A gate of the forty-third thin film transistor T43 is electrically connected to the third node QB, and a source thereof is electrically connected to the n+1th stage signal Cout(n+1) outputted by the latter one-stage n+1th stage GOA circuit sharing unit, and a drain thereof is electrically connected to the second negative potential (VGL2); a gate of the forty-fourth thin film transistor T44 is electrically connected to the third node QB, a source thereof is electrically connected to the nth stage signal Cout(n) outputted by the nth stage GOA circuit sharing unit, and a drain thereof is electrically connected to the second negative potential (VGL2); a gate of the forty-fifth thin film transistor T45 is electrically connected to the third node QB, a source thereof is electrically connected to the second node N, and a drain thereof is electrically connected to the first negative potential (VGL1); a gate of the forty-sixth thin film transistor T46 is electrically connected to the third node QB, a source thereof is electrically connected to the first node Q, and a drain thereof is electrically connected to the second node N.

The fifty-first thin film transistor T51 and the fifty-second thin film transistor T52 are first dual gate transistors, and the fifty-third thin film transistor T53 and the fifty-fourth thin film transistor T54 are second double gate transistors.

The first dual gate transistor comprises a source transistor (the fifty-first thin film transistor T51) and a drain transistor (the fifty-second thin film transistor T52), and the source transistor (the fifty-first thin film transistor T51) and a drain transistor (the fifty-second thin film transistor T52) of the first dual gate transistor have a gate, a source, and a drain, respectively, the source and the gate of the source transistor (the fifty-first thin film transistor T51) of the first dual gate transistor are electrically connected to a high potential (VGH), the drain of the source transistor (the fifty-first thin film transistor T51) of the first dual gate transistor is electrically connected to the source of the drain transistor (the fifty-second thin film transistor T52) of the first dual gate transistor, the gate of the drain transistor (the fifty-second thin film transistor T52) of the first dual gate transistor is electrically connected to the first node Q, and the drain of the drain transistor (the fifty-second thin film transistor T52) of the first dual gate transistor is electrically connected to the first negative potential (VGL1).

The second dual gate transistor comprises a source transistor (the fifty-third thin film transistor T53) and a drain transistor (the fifty-fourth thin film transistor T54), and the source transistor (the fifty-third thin film transistor T53) and the drain transistor (the fifty-fourth thin film transistor T54) of the second dual gate transistor have a gate, a source, and a drain, respectively, the gate of the source transistor (the fifty-third thin film transistor T53) of the second dual gate transistor is electrically connected to the drain of the source transistor (the fifty-first thin film transistor T51) of the first dual gate transistor, the source of the source transistor (the fifty-third thin film transistor T53) of the second dual gate transistor is electrically connected to the high potential (VGH), the drain of the source transistor (the fifty-third thin film transistor T53) of the second dual gate transistor is electrically connected to the source of the drain transistor (the fifty-fourth thin film transistor T54) and is electrically connected to the third node QB, the gate of the drain transistor (the fifty-fourth thin film transistor T54) of the second dual gate transistor is electrically connected to the first node Q, and the drain of the drain transistor (the fifty-fourth thin film transistor T54) of the second dual gate transistor is electrically connected to the first negative potential (VGL1).

The second pull-down maintaining module 107 comprises a forty-first thin film transistor T41 and a forty-second thin film transistor T42.

A gate of the forty-first thin film transistor T41 is electrically connected to the third node QB, a source thereof is electrically connected to the n+1th scanning signal G(n+1) outputted by the latter one-stage n+1th stage GOA circuit sharing unit, and a drain thereof is electrically connected to the second negative potential (VGL2); a gate of the forty-second thin film transistor T42 is electrically connected to the third node QB, a source thereof is electrically connected to the nth scanning signal G(n) outputted by the nth stage GOA circuit sharing unit, and a drain thereof is electrically connected to the second negative potential (VGL2).

The feedback module 101 of this embodiment is responsible for raising the potential of the second node N, which is beneficial for suppressing leakage of the first node Q and maintaining the potential of the first node Q.

The feedback module 101 comprises a sixty-first thin film transistor T61 and a sixty-second thin film transistor T62.

A gate of the sixty-first thin film transistor T61 is electrically connected to the M+2th clock signal CK(M+2), a source thereof is electrically connected to the nth stage signal Cout(n) outputted by the nth stage GOA circuit sharing unit, and a drain thereof is electrically connected to the second node N; a gate of the sixty-second thin film transistor T62 is electrically connected to the M+3th clock signal CK(M+3), a source thereof is electrically connected to the second node N, and a drain thereof is electrically connected to the n+1th stage signal Cout(n+1) outputted by the latter one-stage n+1th stage GOA circuit sharing unit.

The function of the bootstrap capacitor module 103 of this embodiment is responsible for the secondary rise of the potential of the first node Q, which facilitates the output of the scanning signal G(n).

The bootstrap capacitor module 103 includes a capacitor (Cbt), an end of the capacitor (Cbt) is electrically connected to the first node Q, and another end thereof is electrically connected to the nth-stage signal Cout(n).

In details, in the first-stage and second-stage GOA circuit sharing units, gates of the eleventh thin film transistor T11 and the twelfth thin film transistor T12 are electrically connected to a start signal (STV) of the GOA circuit.

Figure 2:
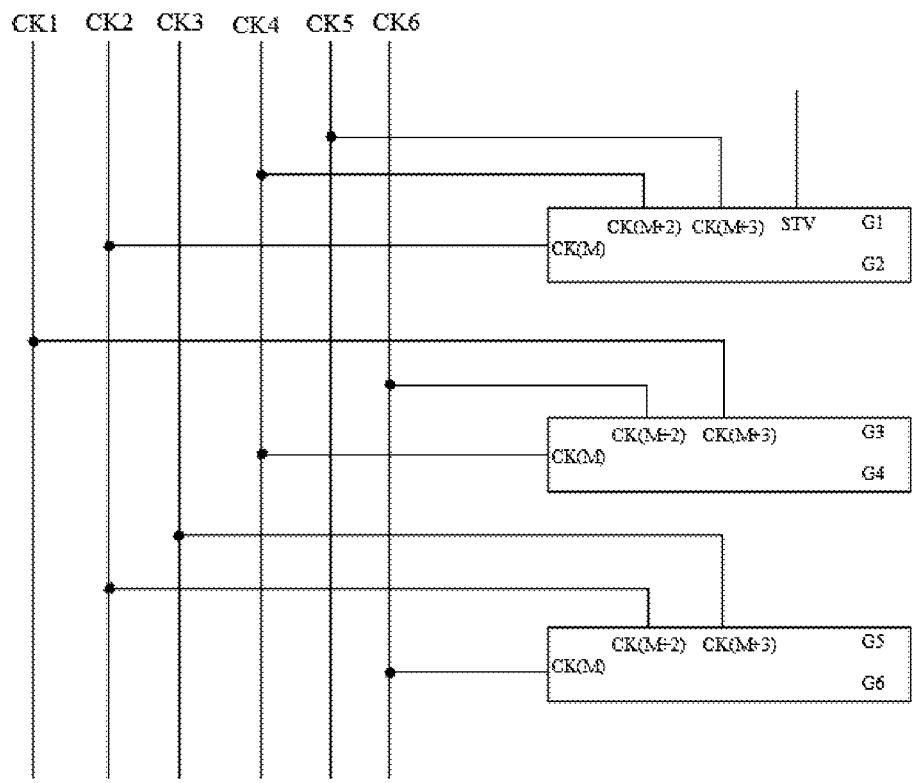
FIG. 2 is a timing diagram of a GOA circuit according to an embodiment of the present disclosure.
Figure 3:
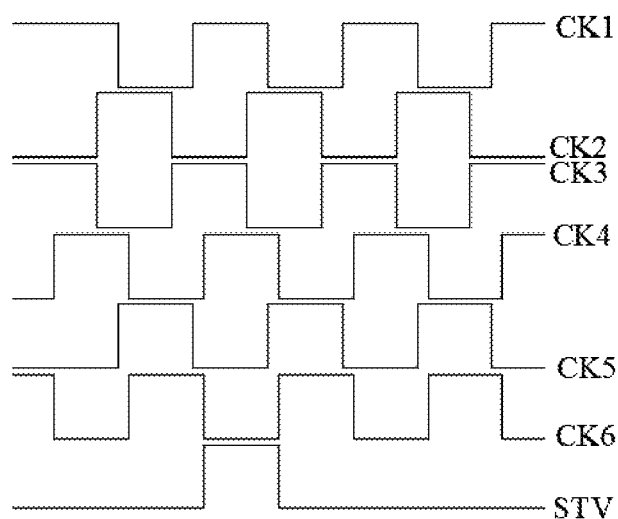
FIG. 3 is a timing signal waveform diagram of a GOA circuit according to an embodiment of the present disclosure.

It should be noted that, as shown in FIG. 2 and FIG. 3, the GOA circuit further comprises six clock signals comprising first, second, third, fourth, fifth, and sixth clock signals (CK(1), CK(2), CK(3), CK(4), CK(5), CK(6)), wherein when the Mth clock signal (CK(M)) is the second clock signal (CK(2)), the M+2th clock signal (CK(M+2)) is the fourth clock signal (CK(4)), and the M+3th clock signal (CK(M+3)) is the fifth clock signal (CK (5)), when the Mth clock signal (CK(M)) is the fourth clock signal (CK(4)), the M+2th clock signal (CK(M+2)) is the sixth clock signal (CK(6)), and the M+3th clock signal (CK(M+3)) is the first clock signal (CK(1)), when the Mth clock signal (CK(M)) is the sixth clock signal (CK(6)), the M+2th clock signal (CK(M+2)) is the second clock signal (CK(2)), and the M+3th clock signal (CK(M+3)) is the third clock signal (CK(3)).

In the first-stage GOA circuit sharing unit and the second-stage GOA circuit sharing unit, the pull-up module 104 is connected to the fourth and fifth clock signals (CK(4), CK(5)), the pull-up control module 102 is connected to the second clock signal (CK(2)), and the feedback module 101 is connected to the fourth and fifth clock signals (CK(4), CK(5)); in a latter two-stage GOA circuit sharing unit, the pull-up control module 102 is connected to the Mth clock signal CK(M), and the Mth clock signal is the fourth clock signal.

Specifically, the second, fourth, and fifth clock signals (CK(2), CK(4), CK(5)) are AC power sources, and the high potential, the first negative potential (VGL1), and the second negative potential (VGL2) are DC power supplies.

Figure 4:
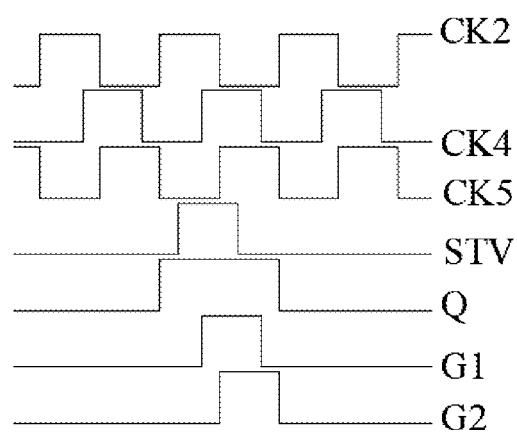
FIG. 4 is a signal waveform diagram of a first stage GOA circuit and a second stage GOA circuit of a GOA circuit according to an embodiment of the present disclosure.

Simulation waveforms in FIG. 3 are brought into the circuit for simulation, and a very good signal output is obtained, as shown in FIG. 4.

Specifically, with reference to FIG. 4, the embodiment uses the first-stage and second-stage GOA sharing circuits as examples to illustrate the working process of the circuit:

First, when the start signal (STV) is at a high potential, the second clock signal (CK2) is simultaneously at a high potential, and the eleventh thin film transistor T11 and the twelfth thin film transistor T12 are turned on, and a high potential is transmitted to the first node. Q, the first node Q is at a high potential, and the twenty-first thin film transistor T21, the twenty-second thin film transistor T22, the twenty-third thin film transistor T23, and the twenty-fourth thin film transistor T24 are turned on. Since the inverter structure (the fifty-first thin film transistor T51 to the fifty-fourth thin film transistor T54) is connected between the first node Q and the third node QB, the potentials between them is opposite, and therefore, the third node QB is at a low potential. The forty-first thin film transistor T41, the forty-second thin film transistor T42, the forty-third thin film transistor T43, the forty-fourth thin film transistor T44, the forty-fifth thin film transistor T45, and the forty-sixth thin film transistor T46 are turned off. At the same time, the fourth-stage signal Cout(4) and the fifth-stage signal Cout(5) are at a low potential, and the thirty-first thin film transistor T31, the thirty-second thin film transistor T32, the thirty-third thin film transistor T33, and the thirty-fourth thin film transistor T34 are turned off, the fourth clock signal CK(4) and the fifth clock signal CK(5) are at a low potential, and the output first-stage signal Cout(1), the output second-stage signal Cout(2), the output first scanning signal G(1), and the output second scanning signal G(2) are at a low potential.

Then, the fourth clock signal CK(4) rises to a high potential, and the eleventh thin film transistor T11 and the twelfth thin film transistor T12 are turned off. At this time, the first node Q is subjected to a capacitive coupling effect and is lifted to a higher potential. The third node QB maintains a low potential. The thirty-first thin film transistor T31, the thirty-second thin film transistor T32, the thirty-third thin film transistor T33, the thirty-fourth thin film transistor T34, the forty-first thin film transistor T41, the forty-second thin film transistor T42, the fourth The thirteen thin film transistor T43, the forty fourth thin film transistor T44, the forty fifth thin film transistor T45, and the forty-sixth thin film transistor T46 continue to be turned off. At this time, the first-stage signal Cout(1) and the first scanning signal G(1) are at a high potential. At this time, the sixty-first thin film transistor T61 is turned on, and the second node N is at a high potential, which reduces leakage currents of the twelfth thin film transistor T12, the forty-sixth thin film transistor T46, and the thirty-third thin film transistor T33.

Then, the fifth clock signal CK(5) rises to a high potential, the first node Q maintains a high potential, and the thirty-first thin film transistor T31, the thirty-second thin film transistor T32, the thirty-third thin film transistor T33, the thirty-fourth thin film transistor T34, the forty-first thin film transistor T41, the forty-second thin film transistor T42, the forty-third thin film transistor T43, the forty-fourth thin film transistor T44, the forty-fifth thin film transistor T45, and the forty-sixth thin film transistor T46 continues to be turned off. At this time, the second-stage signal Cout(2) and the second scanning signal G(2) are at a high potential, and the second node N is at a high potential.

Subsequently, the fourth clock signal CK(4) is lowered to a low potential. The eleventh thin film transistor T11, the twelfth thin film transistor T12, the forty-fifth thin film transistor T45, the forty-sixth thin film transistor T46, the thirty-third thin film transistor T33, and the thirty-fourth thin film transistor T34 are turned off, the first node Q is maintained at a high potential. At the same time, the thirty-second thin film transistor T32 is turned on, the output first-stage signal Cout(1) and the output first scanning signal G(1) are lowered to a low potential, and the second node N is maintained at a high potential.

Finally, the fifth clock signal CK(5) is lowered to a low potential, and the thirty-third thin film transistor T33 and the thirty-fourth thin film transistor T34 are turned on, the first node Q is lowered to a low potential, and the twenty-first thin film transistor T21, the twenty-second thin film transistor T22, the twenty-third thin film transistor T23, and the twenty-fourth thin film transistor T24 are turned off. At this time, due to the presence of the inverter, the third node QB is pulled up to a high potential, and the forty-first thin film transistor T41, the forty-fifth thin film transistor T45 and the forty-sixth thin film transistor T46 are turned on, the second-stage signal Cout(2) and the second scanning signal G(2) are pulled to a low potential. The fifth-stage signal Cout(5) rises to a high potential, and the thirty-first thin film transistor T31 is turned on, and the thirty-first thin film transistor T31 and the forty-first thin film transistor T41 simultaneously pull down potentials of the second-stage signal Cout(2) and the second scanning signal G(2).

In summary, beneficial effects of an embodiment of the present disclosure are that, a gate driver on array (GOA) circuit is provided. The GOA circuit is designed to form a GOA sharing unit by arranging adjacent two stage GOA units in a conventional GOA circuit. A new GOA circuit enables single-stage GOA circuit to be shared every two stages of GOA output signals. The new GOA circuit can reduce a number of thin film transistors in the GOA circuit and reduce a wiring design, which helps to reduce a design space of the GOA circuit, realizes a narrow bezel design, simplifies the GOA circuit, and can reduce power consumption of the GOA circuit.

Although the present disclosure is described via one or more embodiments, those of ordinary skill in the art can come up with equivalent variations and modifications based upon the understanding of the specification and the accompanying drawings. The present disclosure includes all such modifications and variations and is only limited by the scope of the appended claims. In particular, as to the various functions performed by the components described above, the terms used to describe the components are intended to correspond to any component performing the specific functions (e.g., which are functionally equivalent) of the components (unless otherwise indicated), even those which are structurally different from the disclosed structure for performing the functions in the exemplary embodiments in the specification shown herein. In addition, although a particular feature in the specification is disclosed in only one of many embodiments, this feature may be combined with one or more features in other embodiments which are desirable and advantageous to a given or particular application. Moreover, the terms "include", "have", "consist of", or variations thereof used in the detailed description or the claims are intended to be used in a manner similar to the term "comprising".

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. A gate driver on array (GOA) circuit, comprising:
a cascaded multi-stage GOA circuit sharing unit, wherein each stage GOA circuit sharing unit comprises a feedback module, a pull-up control module, a pull-up module, a bootstrap capacitor module, a first pull-down maintenance module, a second pull-down maintenance module, a first pull-down module, and a second pull-down module;
wherein the pull-up control module, the bootstrap capacitor module, the pull-up module, the first and second pull-down maintaining modules, and the first and second pull-down modules are all electrically connected to a first node Q, and the feedback module is electrically connected to a second node N;
wherein in the GOA circuit, each two-stage GOA circuit shares a first-stage GOA circuit;
wherein let M and n be positive integers, except for first-stage and second-stage GOA circuit sharing units, in a nth stage GOA circuit sharing unit:
the pull-up module is connected to M+2th and M+3th clock signals CK(M+2) and CK(M+3), and uses the M+2th and M+3th clock signals CK(M+2) and CK(M+3) to output nth and n+1th stage signals (Cout(n) and Cout(n+1)) and nth and n+1th scanning signals (G(n) and G(n+1));
the pull-up control module is connected to a Mth clock signal CK(M) and a n−2th stage signal Cout(n−2) outputted by a former two-stage n−2th stage GOA circuit sharing unit, and the n−2th stage signal Cout(n−2) is used to charge the first node Q;
the first pull-down module is connected to at least n+3th and n+4th stage signals (Cout(n+3) and Cout(n+4)) outputted by a latter three-stage n+3th stage GOA circuit sharing unit and a latter four-stage n+4th stage GOA circuit sharing unit and a first negative potential (VGL1), and the second pull-down module is connected to at least the n+4th stage signal Cout(n+4) outputted by the latter four-stage n+4th stage GOA circuit sharing unit and a second negative potential (VGL2);
the first pull-down maintenance module is connected to at least the first negative potential (VGL1), a high potential (VGH), and a third node QB, and the second pull-down maintenance module is connected to at least the third node QB;
the feedback module is connected to at least the M+2th and M+3th clock signals CK(M+2) and CK(M+3) and the nth and n+1th stage signals (Cout(n) and Cout(n+1));
wherein except for first-stage and second-stage GOA circuit sharing units, in the nth stage GOA circuit sharing unit:
the pull-up control module comprises an eleventh thin film transistor, a gate of the eleventh thin film transistor is connected to the n−2th stage signal Cout(n−2) outputted by the former two-stage n−2th stage GOA circuit sharing unit, a source thereof is connected to the Mth clock signal CK(M), and a drain thereof is electrically connected to the second node N; and a twelfth thin film transistor, a gate of the twelfth thin film transistor is connected to the n−2th stage signal Cout (n−2) outputted by the former two-stage n−2th stage GOA circuit sharing unit, a source thereof is electrically connected to the second node N, and a drain thereof is electrically connected to the first node Q;

wherein the pull-up module comprises:

a twenty-first thin film transistor, a gate of the twenty-first thin film transistor is electrically connected to the first node Q, a source thereof is connected to the M+3th clock signal CK(M+3), and a drain thereof is electrically connected the n+1th scanning signal G(n+1) outputted by a latter one-stage n+1th stage GOA circuit sharing unit;

a twenty-second thin film transistor, a gate of the twenty-second thin film transistor is electrically connected to the first node Q, a source thereof is connected to the M+2th clock signal CK(M+2), and a drain thereof is electrically connected the nth scanning signal G(n);

a twenty-third thin film transistor, a gate of the twenty-third thin film transistor is electrically connected to the first node Q, a source thereof is connected to the M+3th clock signal CK(M+3), and a drain thereof is electrically connected to the n+1th stage signal Cout(n+1) outputted by the latter one-stage n+1th stage GOA circuit sharing unit; and a twenty-fourth thin film transistor, a gate of the twenty-fourth thin film transistor is electrically connected to the first node Q, a source thereof is connected to the M+2th clock signal CK(M+2), and a drain thereof is electrically connected to the nth stage signal Cout(n).

2. The GOA circuit according to claim 1, wherein the second pull-down module comprises a thirty-first thin film transistor, a gate of the thirty-first thin film transistor is electrically connected to the n+4th stage signal Cout(n+4) outputted by the latter four-stage n+4th stage GOA circuit sharing unit, a source thereof is electrically connected to the n+1th scanning signal G(n+1) outputted by the latter one-stage n+1th stage GOA circuit sharing unit, and a drain thereof is electrically connected to the second negative potential (VGL2).

3. The GOA circuit according to claim 1, wherein the first pull-down module comprises:

a thirty-second thin film transistor, a gate of the thirty-second thin film transistor is electrically connected to the n+3th stage signal Cout(n+3) outputted by the latter three-stage n+3th stage GOA circuit sharing unit, a source thereof is electrically connected to the nth scanning signal G(n), and a drain thereof is electrically connected to the second negative potential (VGL2);

a thirty-third thin film transistor, wherein a gate of the thirty-third thin film transistor is electrically connected to the n+4th stage signal Cout(n+4) outputted by the latter four-stage n+4th stage GOA circuit sharing unit, a source thereof is electrically connected to the first node Q, and a drain thereof is electrically connected to the second node N; and a thirty-fourth thin film transistor, wherein a gate of the thirty-fourth thin film transistor is electrically connected to the n+4th stage signal Cout(n+4) outputted by the latter four-stage n+4th stage GOA circuit sharing unit, a source thereof is electrically connected to the second node N, and a drain thereof is electrically connected to the first negative potential (VGL1).

4. The GOA circuit according to claim 1, wherein the first pull-down maintaining module comprises a forty-third thin film transistor, a forty-fourth thin film transistor, a forty-fifth thin film transistor, a forty-sixth thin film transistor, a fifty-first thin film transistor, a fifty-second thin film transistor, a fifty-third thin film transistor, and a fifty-fourth thin film transistor;

a gate of the forty-third thin film transistor is electrically connected to the third node QB, and a source thereof is electrically connected to the n+1th stage signal Cout (n+1) outputted by the latter one-stage n+1th stage GOA circuit sharing unit, and a drain thereof is electrically connected to the second negative potential (VGL2); a gate of the forty-fourth thin film transistor is electrically connected to the third node QB, a source thereof is electrically connected to the nth stage signal Cout(n) outputted by the nth stage GOA circuit sharing unit, and a drain thereof is electrically connected to the second negative potential (VGL2); a gate of the forty-fifth thin film transistor is electrically connected to the third node QB, a source thereof is electrically connected to the second node N, and a drain thereof is electrically connected to the first negative potential (VGL1); a gate of the forty-sixth thin film transistor is electrically connected to the third node QB, a source thereof is electrically connected to the first node Q, and a drain thereof is electrically connected to the second node N;

the fifty-first thin film transistor and the fifty-second thin film transistor are first dual gate transistors, and the fifty-third thin film transistor and the fifty-fourth thin film transistor are second double gate transistors;

the first dual gate transistor comprises a source transistor and a drain transistor, and the source transistor and the drain transistor of the first dual gate transistor have a gate, a source, and a drain, respectively, the source and the gate of the source transistor of the first dual gate transistor are electrically connected to a high potential (VGH), the drain of the source transistor of the first dual gate transistor is electrically connected to the source of the drain transistor of the first dual gate transistor, the gate of the drain transistor of the first dual gate transistor is electrically connected to the first node Q, and the drain of the drain transistor of the first dual gate transistor is electrically connected to the first negative potential (VGL1);

the second dual gate transistor comprises a source transistor and a drain transistor, and the source transistor and the drain transistor of the second dual gate transistor have a gate, a source, and a drain, respectively, the gate of the source transistor of the second dual gate transistor is electrically connected to the drain of the source transistor of the first dual gate transistor, the source of the source transistor of the second dual gate transistor is electrically connected to the high potential (VGH), the drain of the source transistor of the second dual gate transistor is electrically connected to the source of the drain transistor and is electrically connected to the third node QB, the gate of the drain transistor of the second dual gate transistor is electrically connected to the first node Q, and the drain of the drain transistor of the second dual gate transistor is electrically connected to the first negative potential (VGL1).

5. The GOA circuit according to claim 1, wherein the second pull-down maintaining module comprises a forty-first thin film transistor and a forty-second thin film transistor;
a gate of the forty-first thin film transistor is electrically connected to the third node QB, a source thereof is electrically connected to the n+1th scanning signal G(n+1) outputted by the latter one-stage n+1th stage GOA circuit sharing unit, and a drain thereof is electrically connected to the second negative potential (VGL2); a gate of the forty-second thin film transistor is electrically connected to the third node QB, a source thereof is electrically connected to the nth scanning signal G(n) outputted by the nth stage GOA circuit sharing unit, and a drain thereof is electrically connected to the second negative potential (VGL2).

6. The GOA circuit according to claim 1, wherein the feedback module comprises a sixty-first thin film transistor and a sixty-second thin film transistor;
a gate of the sixty-first thin film transistor is electrically connected to the M+2th clock signal CK(M+2), a source thereof is electrically connected to the nth stage signal Cout(n) outputted by the nth stage GOA circuit sharing unit, and a drain thereof is electrically connected to the second node N; a gate of the sixty-second thin film transistor is electrically connected to the M+3th clock signal CK(M+3), a source thereof is electrically connected to the second node N, and a drain thereof is electrically connected to the n+1th stage signal Cout(n+1) outputted by the latter one-stage n+1th stage GOA circuit sharing unit.

7. The GOA circuit according to claim 1, wherein in the first-stage and second-stage GOA circuit sharing units, gates of the eleventh thin film transistor and the twelfth thin film transistor are electrically connected to a start signal (STV) of the GOA circuit.

8. The GOA circuit according to claim 1, further comprising six clock signals comprising first, second, third, fourth, fifth, and sixth clock signals (CK(1), CK(2), CK(3), CK(4), CK(5), CK(6)), wherein when the Mth clock signal (CK(M)) is the second clock signal (CK(2)), the M+2th clock signal (CK(M+2)) is the fourth clock signal (CK(4)), and the M+3th clock signal (CK(M+3)) is the fifth clock signal (CK (5)), when the Mth clock signal (CK(M)) is the fourth clock signal (CK(4)), the M+2th clock signal (CK (M+2)) is the sixth clock signal (CK(6)) and the M+3th clock signal (CK(M+3)) is the first clock signal (CK(1)), when the Mth clock signal (CK(M)) is the sixth clock signal (CK(6)), the M+2th clock signal (CK(M+2)) is the second clock signal (CK(2)), and the M+3th clock signal (CK(M+3)) is the third clock signal (CK(3));
wherein in the first-stage GOA circuit sharing unit and the second-stage GOA circuit sharing unit, the pull-up module is connected to the fourth and fifth clock signals (CK(4), CK(5)), the pull-up control module is connected to the second clock signal (CK(2)), and the feedback module is connected to the fourth and fifth clock signals (CK(4), CK(5)); in a latter two-stage GOA circuit sharing unit, the pull-up control module is connected to the Mth clock signal CK(M), and the Mth clock signal is the fourth clock signal.

9. A gate driver on array (GOA) circuit, comprising:
a cascaded multi-stage GOA circuit sharing unit, wherein each stage GOA circuit sharing unit comprises a feedback module, a pull-up control module, a pull-up module, a bootstrap capacitor module, a first pull-down maintenance module, a second pull-down maintenance module, a first pull-down module, and a second pull-down module;
wherein the pull-up control module, the bootstrap capacitor module, the pull-up module, the first and second pull-down maintaining modules, and the first and second pull-down modules are all electrically connected to a first node Q, and the feedback module is electrically connected to a second node N;
wherein in the GOA circuit, each two-stage GOA circuit shares a first-stage GOA circuit;
wherein let M and n be positive integers, except for first-stage and second-stage GOA circuit sharing units, in a nth stage GOA circuit sharing unit:
the pull-up module is connected to M+2th and M+3th clock signals CK(M+2) and CK(M+3), and uses the M+2th and M+3th clock signals CK(M+2) and CK(M+3) to output nth and n+1th stage signals (Cout(n) and Cout(n+1)) and nth and n+1th scanning signals (G (n) and G(n+1));
the pull-up control module is connected to a Mth clock signal CK(M) and a n−2th stage signal Cout(n−2) outputted by a former two-stage n−2th stage GOA circuit sharing unit, and the n−2th stage signal Cout (n−2) is used to charge the first node Q;
the first pull-down module is connected to at least n+3th and n+4th stage signals (Cout(n+3) and Cout(n+4)) outputted by a latter three-stage n+3th stage GOA circuit sharing unit and a latter four-stage n+4th stage GOA circuit sharing unit and a first negative potential (VGL1), and the second pull-down module is connected to at least the n+4th stage signal Cout(n+4) outputted by the latter four-stage n+4th stage GOA circuit sharing unit and a second negative potential (VGL2);
the first pull-down maintenance module is connected to at least the first negative potential (VGL1), a high potential (VGH), and a third node QB, and the second pull-down maintenance module is connected to at least the third node QB;
the feedback module is connected to at least the M+2th and M+3th clock signals CK(M+2) and CK(M+3) and the nth and n+1th stage signals (Cout(n) and Cout(n+1)).

10. The GOA circuit according to claim 9, wherein except for first-stage and second-stage GOA circuit sharing units, in the nth stage GOA circuit sharing unit:
the pull-up control module comprises an eleventh thin film transistor, a gate of the eleventh thin film transistor is connected to the n−2th stage signal Cout(n−2) outputted by the former two-stage n−2th stage GOA circuit sharing unit, a source thereof is connected to the Mth clock signal CK(M), and a drain thereof is electrically connected to the second node N; and
a twelfth thin film transistor, a gate of the twelfth thin film transistor is connected to the n−2th stage signal Cout (n−2) outputted by the former two-stage n−2th stage GOA circuit sharing unit, a source thereof is electrically connected to the second node N, and a drain thereof is electrically connected to the first node Q.

11. The GOA circuit according to claim 10, wherein in the first-stage and second-stage GOA circuit sharing units, gates of the eleventh thin film transistor and the twelfth thin film transistor are electrically connected to a start signal (STV) of the GOA circuit.

12. The GOA circuit according to claim 9, wherein the pull-up module comprises:

a twenty-first thin film transistor, a gate of the twenty-first thin film transistor is electrically connected to the first node Q, a source thereof is connected to the M+3th clock signal CK(M+3), and a drain thereof is electrically connected the n+1th scanning signal G(n+1) outputted by a latter one-stage n+1th stage GOA circuit sharing unit;

a twenty-second thin film transistor, a gate of the twenty-second thin film transistor is electrically connected to the first node Q, a source thereof is connected to the M+2th clock signal CK(M+2), and a drain thereof is electrically connected the nth scanning signal G(n);

a twenty-third thin film transistor, a gate of the twenty-third thin film transistor is electrically connected to the first node Q, a source thereof is connected to the M+3th clock signal CK(M+3), and a drain thereof is electrically connected to the n+1th stage signal Cout(n+1) outputted by the latter one-stage n+1th stage GOA circuit sharing unit; and a twenty-fourth thin film transistor, a gate of the twenty-fourth thin film transistor is electrically connected to the first node Q, a source thereof is connected to the M+2th clock signal CK(M+2), and a drain thereof is electrically connected to the nth stage signal Cout(n).

13. The GOA circuit according to claim 9, wherein the second pull-down module comprises a thirty-first thin film transistor, a gate of the thirty-first thin film transistor is electrically connected to the n+4th stage signal Cout(n+4) outputted by the latter four-stage n+4th stage GOA circuit sharing unit, a source thereof is electrically connected to the n+1th scanning signal G(n+1) outputted by the latter one-stage n+1th stage GOA circuit sharing unit, and a drain thereof is electrically connected to the second negative potential (VGL2).

14. The GOA circuit according to claim 9, wherein the first pull-down module comprises:

a thirty-second thin film transistor, a gate of the thirty-second thin film transistor is electrically connected to the n+3th stage signal Cout(n+3) outputted by the latter three-stage n+3th stage GOA circuit sharing unit, a source thereof is electrically connected to the nth scanning signal G(n), and a drain thereof is electrically connected to the second negative potential (VGL2);

a thirty-third thin film, transistor, wherein a gate of the thirty-third thin film transistor is electrically connected to the n+4th stage signal Cout(n+4) outputted by the latter four-stage n+4th stage GOA circuit sharing unit, a source thereof is electrically connected to the first node Q, and a drain thereof is electrically connected to the second node N; and a thirty-fourth thin film transistor, wherein a gate of the thirty-fourth thin film transistor is electrically connected to the n+4th stage signal Cout(n+4) outputted by the latter four-stage n+4th stage GOA circuit sharing unit, a source thereof is electrically connected to the second node N, and a drain thereof is electrically connected to the first negative potential (VGL1).

15. The GOA circuit according to claim 9, wherein the first pull-down maintaining module comprises a forty-third thin film transistor, a forty-fourth thin film transistor, a forty-fifth thin film transistor, a forty-sixth thin film transistor, a fifty-first thin film transistor, a fifty-second thin film transistor, a fifty-third thin film transistor, and a fifty-fourth thin film transistor;

a gate of the forty-third thin film transistor is electrically connected to the third node QB, and a source thereof is electrically connected to the n+1th stage signal Cout (n+1) outputted by the latter one-stage n+1th stage GOA circuit sharing unit, and a drain thereof is electrically connected to the second negative potential (VGL2); a gate of the forty-fourth thin film transistor is electrically connected to the third node QB, a source thereof is electrically connected to the nth stage signal Cout(n) outputted by the nth stage GOA circuit sharing unit, and a drain thereof is electrically connected to the second negative potential (VGL2); a gate of the forty-fifth thin film transistor is electrically connected to the third node QB, a source thereof is electrically connected to the second node N, and a drain thereof is electrically connected to the first negative potential (VGL1); a gate of the forty-sixth thin film transistor is electrically connected to the third node QB, a source thereof is, electrically connected to the first node Q, and a drain thereof is electrically connected to the second node N;

the fifty-first thin film transistor and the fifty-second thin film transistor are first dual gate transistors, and the fifty-third thin film transistor and the fifty-fourth thin film transistor are second double gate transistors;

the first dual gate transistor comprises a source transistor and a drain transistor, and the source transistor and the drain transistor of the first dual gate transistor have a gate, a source, and a drain, respectively, the source and the gate of the source transistor of the first dual gate transistor are electrically connected to a high potential (VGH), the drain of the source transistor of the first dual gate transistor is electrically connected to the source of the drain transistor of the first dual gate transistor, the gate of the drain transistor of the first dual gate transistor is electrically connected to the first node Q, and the drain of the drain transistor of the first dual gate transistor is electrically connected to the first negative potential (VGL1);

the second dual gate transistor comprises a source transistor and a drain transistor, and the source transistor and the drain transistor of the second dual gate transistor have a gate, a source, and a drain, respectively, the gate of the source transistor of the second dual gate transistor is electrically connected to the drain of the source transistor of the first dual gate transistor, the source of the source transistor of the second dual gate transistor is electrically connected to the high potential (VGH), the drain of the source transistor of the second dual gate transistor is electrically connected to the source of the drain transistor and is electrically connected to the third node QB, the gate of the drain transistor of the second dual gate transistor is electrically connected to the first node Q, and the drain of the drain transistor of the second dual gate transistor is electrically connected to the first negative potential (VGL1).

16. The GOA circuit according to claim 9, wherein the second pull-down maintaining module comprises a forty-first thin film transistor and a forty-second thin film transistor;

a gate of the forty-first thin film transistor is electrically connected to the third node QB, a source thereof is electrically connected to the n+1th scanning signal G(n+1) outputted by the latter one-stage n+1th stage GOA circuit sharing unit, and a drain thereof is electrically connected to the second negative potential (VGL2); a gate of the forty-second thin film transistor is electrically connected to the third node QB, a source thereof is electrically connected to the nth scanning signal G(n) outputted by the nth stage GOA circuit sharing unit, and a drain thereof is electrically connected to the second negative potential (VGL2).

17. The GOA circuit according to claim 9, wherein the feedback module comprises a sixty-first thin film transistor and a sixty-second thin film transistor;
a gate of the sixty-first thin film transistor is electrically connected to the M+2th clock signal CK(M+2), a source thereof is electrically connected to the nth stage signal Cout(n) outputted by the nth stage GOA circuit sharing unit, and a drain thereof is electrically connected to the second node N; a gate of the sixty-second thin film transistor is electrically connected to the M+3th clock signal CK(M+3), a source thereof is electrically connected to the second node N, and a drain thereof is electrically connected to the n+1th stage signal Cout(n+1) outputted by the latter one-stage n+1th stage GOA circuit sharing unit.

18. The GOA circuit according to claim 9, further comprising six clock signals comprising first, second, third, fourth, fifth, and sixth clock signals (CK(1), CK(2), CK(3), CK(4), CK(5), CK(6)), wherein when the Mth clock signal (CK(M)) is the second clock signal (CK(2)), the M+2th clock signal (CK(M+2)) is the fourth clock signal (CK(4)), and the M+3th clock signal (CK(M+3)) is the fifth clock signal (CK (5)), when the Mth clock signal (CK(M)) is the fourth clock signal (CK(4)), the M+2th clock signal (CK(M+2)) is the sixth clock signal (CK(6)), and the M+3th clock signal (CK(M+3)) is the first clock signal (CK(1)), when the Mth clock signal (CK(M)) is the sixth clock signal (CK(6)), the M+2th clock signal (CK(M+2)) is the second clock signal (CK(2)), and the M+3th clock signal (CK(M+3)) is the third clock signal (CK(3));
wherein in the first-stage GOA circuit sharing unit and the second-stage GOA circuit sharing unit, the pull-up module is connected to the fourth and fifth clock signals (CK(4), CK(5)), the pull-up control module is connected to the second clock signal (CK(2)), and the feedback module is connected to the fourth and fifth clock signals (CK(4), CK(5)); in a latter two-stage GOA circuit sharing unit, the pull-up control module is connected to the Mth clock signal CK(M), and the Mth clock signal is the fourth clock signal.

* * * * *